(12) United States Patent
Thorum (10) Patent No.: US 11,791,152 B2
(45) Date of Patent: Oct. 17, 2023

(54) RESIDUE REMOVAL DURING SEMICONDUCTOR DEVICE FORMATION

(71) Applicant: Micron Technology, Inc., Boise, ID (US)

(72) Inventor: Matthew S. Thorum, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 176 days.

(21) Appl. No.: 17/344,168

(22) Filed: Jun. 10, 2021

(65) Prior Publication Data
US 2021/0305039 A1 Sep. 30, 2021

Related U.S. Application Data

(62) Division of application No. 15/847,587, filed on Dec. 19, 2017, now Pat. No. 11,037,779.

(51) Int. Cl.
*H01L 21/02* (2006.01)
*B08B 3/08* (2006.01)
*H01L 21/67* (2006.01)
*B81C 1/00* (2006.01)

(52) U.S. Cl.
CPC ......... *H01L 21/02057* (2013.01); *B08B 3/08* (2013.01); *H01L 21/67028* (2013.01); *H01L 21/67034* (2013.01); *B81C 1/00849* (2013.01)

(58) Field of Classification Search
CPC ......... H01L 21/02057; H01L 21/67028; H01L 21/67034; H01L 21/02046; H01L 21/02052; H01L 21/02172; H01L 21/02631; B81C 1/00849; B08B 3/08
See application file for complete search history.

(56) References Cited

U.S. PATENT DOCUMENTS

| 6,107,166 A | 8/2000 | Butterbaugh |
| 7,749,909 B2 | 7/2010 | Tomita et al. |
| 8,617,993 B2 | 12/2013 | Yasseri et al. |
| 9,653,307 B1 | 5/2017 | Imonigie et al. |
| 2004/0259357 A1 | 12/2004 | Saga |
| 2006/0199399 A1 | 9/2006 | Muscat |
| 2011/0139083 A1 | 6/2011 | Krone et al. |

(Continued)

FOREIGN PATENT DOCUMENTS

| CN | 106298446 A | 1/2017 |
| TW | 201133600 A | 10/2011 |
| TW | 201619361 A | 6/2016 |

OTHER PUBLICATIONS

Buriak "Organometallic Chemistry on Silicon and Germanium Surfaces", Chemical Reviews, vol. 102, No. 5, Mar. 8, 2002, pp. 1271-1308.

(Continued)

*Primary Examiner* — Laura M Menz
*Assistant Examiner* — Candice Chan
(74) *Attorney, Agent, or Firm* — Brooks, Cameron & Huebsch, PLLC (57) ABSTRACT

In an example, a method may include removing a material from a structure to form an opening in the structure, exposing a residue, resulting from removing the material, to an alcohol gas to form a volatile compound, and removing the volatile compound by vaporization. The structure may be used in semiconductor devices, such as memory devices.

17 Claims, 7 Drawing Sheets

(56) References Cited

U.S. PATENT DOCUMENTS

| | | |
|---|---|---|
| 2011/0189858 A1 | 8/2011 | Yasseri et al. |
| 2011/0281379 A1 | 11/2011 | Yang et al. |
| 2013/0081301 A1 | 4/2013 | Gouk et al. |
| 2015/0118821 A1 | 4/2015 | Millward et al. |
| 2015/0128991 A1 | 5/2015 | Brown et al. |
| 2016/0042945 A1 | 2/2016 | Limary et al. |
| 2016/0379833 A1 | 12/2016 | Hong et al. |
| 2017/0098540 A1 | 4/2017 | Xie |
| 2017/0178895 A1* | 6/2017 | Hong .................. H01L 21/0206 |
| 2017/0250094 A1 | 8/2017 | Verhaverbeke et al. |
| 2018/0308707 A1 | 10/2018 | Yamaguchi |
| 2019/0131120 A1 | 5/2019 | Yamaguchi |

OTHER PUBLICATIONS

Chen, et al. "Non-Stiction Performance of Various Post Wet-Clean Drying Schemes on High-Aspect-Ratio Device Structures", The Electrochemical Society, vol. 58, Issue 6, 2013, 1 pp.

Final Rejection from related Korean patent application No. 10-2018-0164184, dated Oct. 28, 2020, 8 pages.

Notice of Non-Preliminary Rejection from related Korean patent application No. 10-2018-0164184, dated Feb. 25, 2020, 12 pages.

Office Action from related Taiwan patent application No. 107143179, dated Jul. 22, 2019, 28 pages.

\* cited by examiner

RESIDUE REMOVAL DURING SEMICONDUCTOR DEVICE FORMATION

PRIORITY INFORMATION

This application is a Divisional of U.S. application Ser. No. 15/847,587, filed on Dec. 19, 2017, the contents of which are incorporated herein by reference.

TECHNICAL FIELD

The present disclosure relates generally to semiconductor processing, and, more particularly, to residue removal (e.g., during semiconductor processing, such as memory device processing).

BACKGROUND

Semiconductor processing (e.g., fabrication) can be used to form semiconductor devices, such as integrated circuits, memory devices, microelectromechanical devices (MEMS), etc.

Examples of memory devices that can be formed by semiconductor processing include, but are not limited to, volatile memory (e.g., that can require power to maintain its data), such as random-access memory (RAM), dynamic random access memory (DRAM), synchronous dynamic random access memory (SDRAM), among others, and non-volatile memory (e.g., that can provide persistent data by retaining stored data when not powered), such as NAND flash memory, NOR flash memory, read only memory (ROM), electrically erasable programmable ROM (EEPROM), erasable programmable ROM (EPROM, among others.

Semiconductor processing can involve forming features (e.g., patterns) on and/or in a substrate, such as a semiconductor (e.g., of silicon), that may be referred to as a wafer. In some examples, one or more materials, such as silicon-based materials (e.g., silicon oxide (SiO), silicon nitride (SiN), tetraethyl orthosilicate (TEOS) and/or polysilicon, among others) may be formed on the substrate. For instance, a deposition process, such as physical vapor deposition (PVD), chemical vapor deposition (CVD), atomic layer deposition (ALD), electrochemical deposition and/or molecular beam epitaxy may be used to form one or more materials on the substrate.

Subsequently, portions of the one or more materials, and in some instances, portions of the substrate, may be removed, such as by wet and/or dry etching, to form the features. In some examples, the features may have high aspect ratios (e.g., ratio of height to width or diameter) and may be referred to as high-aspect-ratio (HAR) features. For example, the features might be separated from each other by HAR openings.

During processing, the substrate and the features may be subjected to wet processing, such as wet cleaning, and subsequent drying. For example, wet cleaning can be helpful to remove residue left behind, such as by the removal process or other processing.

DETAILED DESCRIPTION

The present disclosure includes processing methods associated with forming semiconductor devices, such as integrated circuits, memory devices MEMS, among others. A number of embodiments include methods, comprising: removing a material from a structure to form an opening in the structure, exposing a residue resulting from removing the material, to an alcohol gas to form a volatile compound, and removing the volatile compound by vaporization. The structure may be used in semiconductor devices, such as integrated circuits, memory devices, MEMS, among others.

Embodiments of the present disclosure provide benefits, such as reducing the likelihood of feature collapse (e.g. toppling) during processing compared to previous approaches. For instance, a number of embodiments use a (e.g., an all) dry-cleaning process (e.g., without using any liquids) to remove the residue that remains after forming features using a dry process, such as a dry etch, as opposed to using the wet cleaning processes of previous approaches. For example, forming a volatile compound, such as a volatile solid, from the residue by exposing the residue to the alcohol gas and removing the volatile compound by vaporization, such as by sublimation, is an example of an embodiment of a dry-cleaning process.

Figure 1:
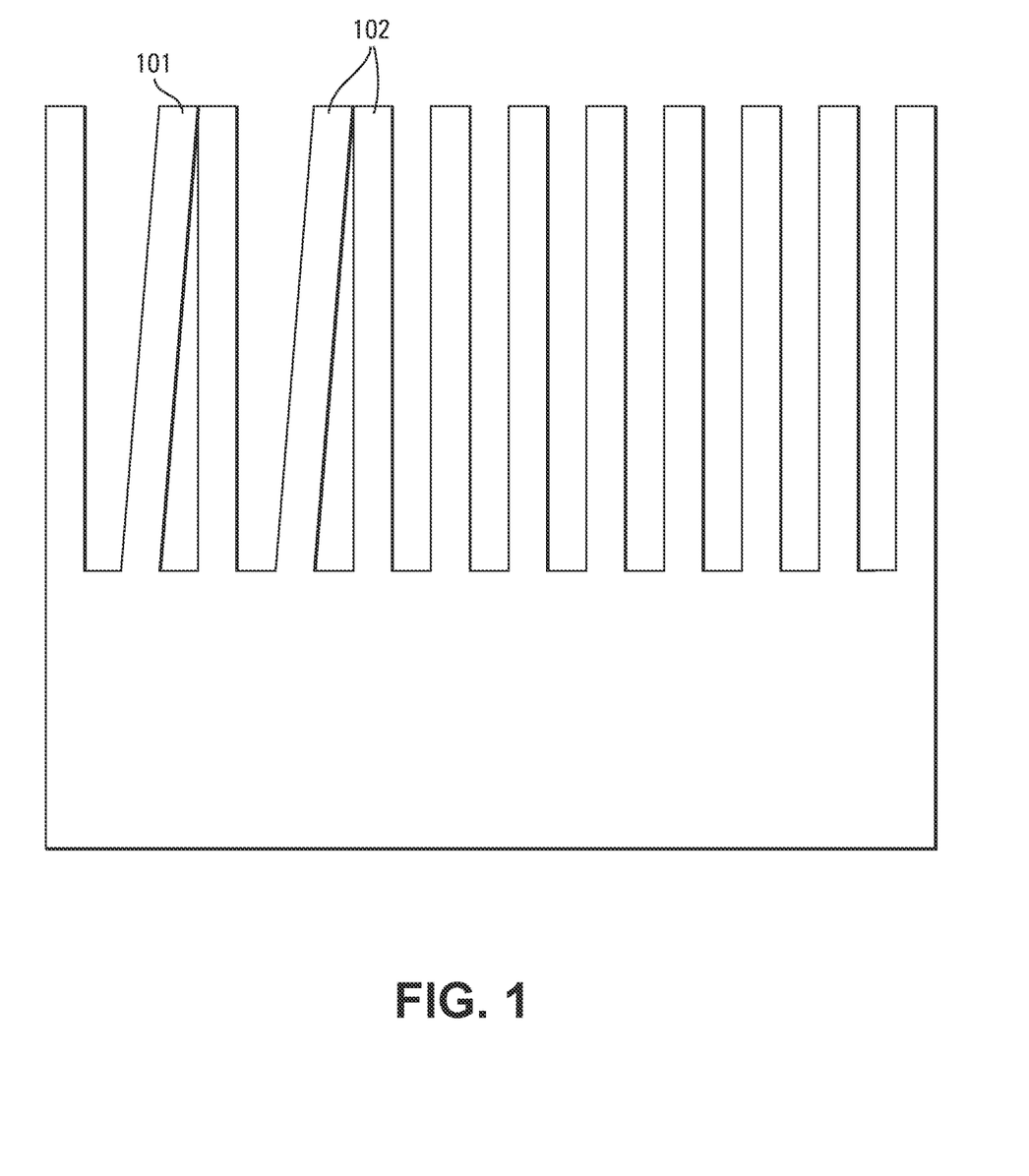
FIG. 1 presents various examples of feature toppling.

Some prior approaches use a wet clean to dissolve and remove the residue from a structure resulting from forming features (e.g., using a dry etch). The structure is then dried (e.g., by exposing the structure to a gas, such as nitrogen) to remove the liquids used during the wet clean. However, during drying, surfaces of the liquid in openings between the features may come in contact with the gas, resulting in capillary forces in the openings at an interface between the liquid and the gas that can cause the features to topple (e.g., collapse) toward each other, bringing adjacent features into contact with each other. For example, FIG. 1 illustrates a feature 101 toppling (e.g., collapsing) into an adjacent feature and a pair of adjacent features 102 toppling into each other (e.g. in what is sometimes referred to as bridging), as a result of the capillary forces in openings between the features caused by the liquid on and/or within the openings being in contact with the gas. This can lead to defects in the semiconductor device, and can even render the semiconductor device inoperable.

The disclosed embodiments eliminate wet cleaning and the associated drying of previous approaches in favor of dry-cleaning processes that convert residues (e.g., left by dry etching) into volatile compounds, such as volatile solids, and that remove the compounds by vaporization, such as by sublimation. For instance, the disclosed dry-cleaning processes reduce the likelihood of (eliminate) the feature collapse associated with wet cleaning of previous approaches.

In the following detailed description, reference is made to the accompanying drawings that form a part hereof, and in which is shown, by way of illustration, specific examples. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the previously formed structures containing such regions/junctions.

FIGS. 2A-2D illustrate cross-sectional views of processing steps associated with forming a semiconductor device, such as a portion of an integrated circuit, a memory device, a MEMS, among others, in accordance with a number of embodiments of the present disclosure. For example, the processing steps may be associated with forming (e.g., a memory array of) a DRAM memory device, a NAND flash memory device, a NOR flash memory device, among others.

Figure 2A:
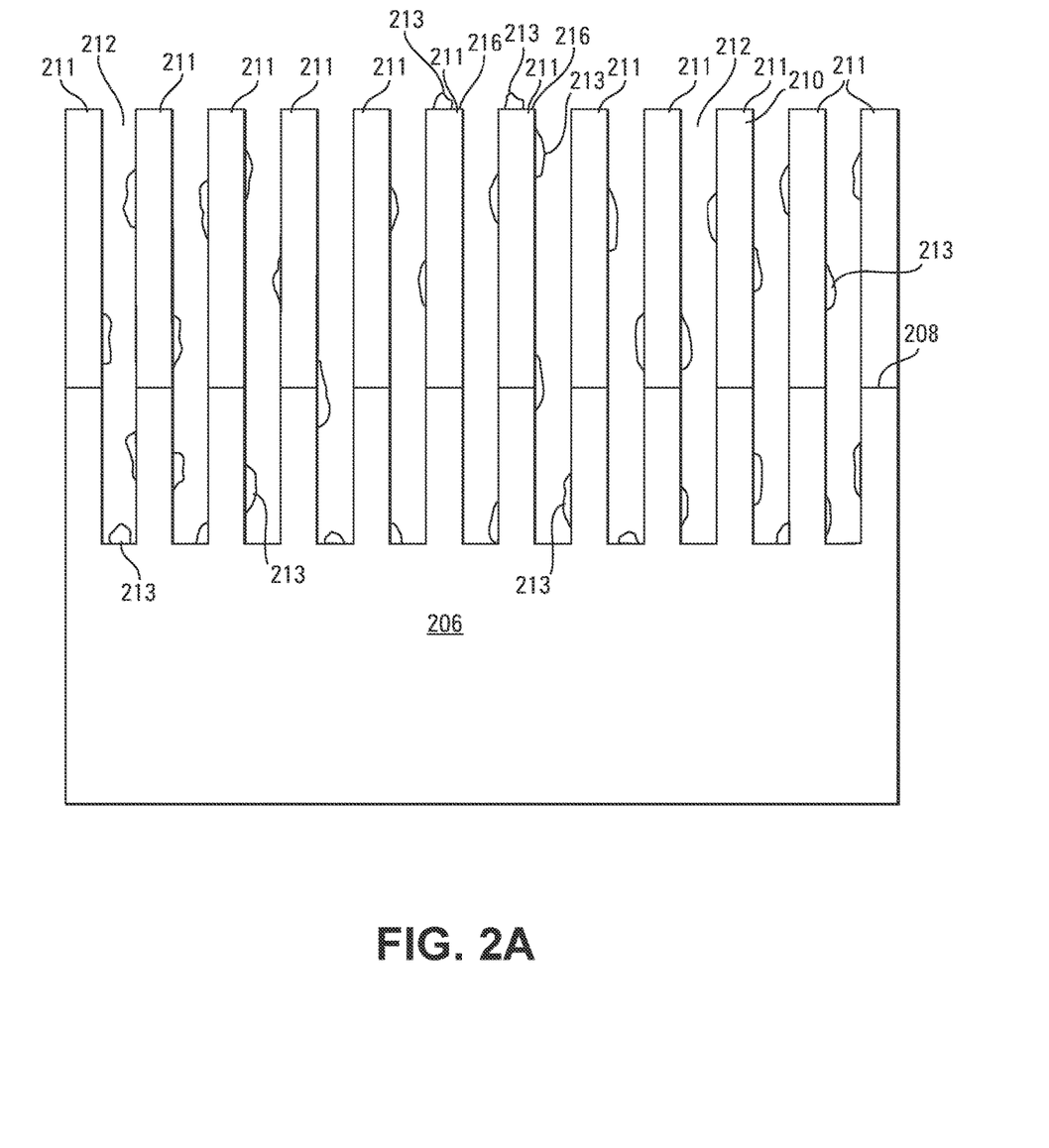
FIGS. 2A-2D illustrate cross-sectional views of processing steps associated with forming a semiconductor device, in accordance with a number of embodiments of the present disclosure.

FIG. 2A depicts a structure (e.g., to be used in a semiconductor device) after several processing steps have occurred. The structure may include a a base structure, such as a substrate 206 (e.g., a semiconductor). In some examples, one or more materials 210, such as silicon-based materials, may be formed on (e.g., over) a surface 208, such as an upper surface, of substrate 206, using, for example, a deposition process, such as PVD, CVD, ALD, electrochemical deposition and/or molecular beam epitaxy.

Features 211, such as nanofeatures (e.g., having a width or diameter of about 0.1 nanometer to about 100 nanometer) are formed by removing portions of the structure, such as portions of the one or more materials 210 and portions of substrate 206. The removal process forms openings 212, such as spaces (e.g., trenches), through the one or more materials 210, stopping on or in (e.g., as shown in FIG. 2A) substrate 206. For example, an opening 212 may be between adjacent features 211. In some examples, each of the respective features 211 includes the one or more materials 210 and a portion of substrate 206.

In some examples, portions of the openings 212 in substrate 206 (e.g., below surface 208) may correspond to isolation regions, such as shallow trench isolation (STI) regions. In an example, a feature 211 may be entirely of substrate 206, and openings 212 may correspond to STI regions. In other examples, features 211 may be the one or more materials 210, such as silicon-based materials. For example, at least a portion of a memory cell, such as a non-volatile memory cell, may be formed from feature 211. For example, a feature may include materials for a memory cell, such as tunnel dielectric, a charge storage material, and a conductor (e.g., for control gate) for a memory cell. In some examples, openings 212 may define memory cells on either side thereof (e.g., features may form memory cells). Features 211 may be HAR features, and openings 212 may be HAR openings. For example, an HAR may have a height to width or diameter ratio of 10 to 1 to 25 to 1 or greater.

In some examples, openings 212, and thus the structure in FIG. 2A, may be formed using dry processing, such as a dry removal process (e.g., a dry etch). For example, a mask (not shown), such as imaging resist (e.g., photo-resist), may be formed over the one or more materials 210 and patterned to expose regions of the one or more materials 210. The exposed regions may be subsequently removed, such as by the dry etch, to form openings 212 that may terminate on or in substrate 206. In some examples, the dry processing may be performed in chamber of a processing apparatus.

As shown in FIG. 2A, residues, such as etch residues 213, resulting from removing the portions of the one or more materials 210 resulting in the structure in FIG. 2A, are left on sides and upper surfaces 216 of features 211 and on the bottoms of openings 212. In some examples, residues 213 may include non-volatile metals, such as aluminum or titanium, among others, halides, such as non-volatile metal halides (e.g., aluminum fluoride), metal oxides, and silicon halides, among others. The presence of the metal may be due to the fact that the chamber in which the structure of FIG. 2A is formed may be fabricated from the metal. For example, the chamber may contribute to the residues during the formation of features 211.

The presence of residues 213 could prevent proper formation of subsequent materials in openings 212 and on (e.g., over) surface 216. Therefore, a dry-cleaning (e.g., an all dry cleaning) process is implemented to remove residues 213 in accordance with a number of embodiments of the present disclosure. For example, the dry cleaning process may be performed in the chamber.

In some examples, the dry-cleaning process may include forming an (e.g., anhydrous) alcohol gas, such as by vaporizing (e.g. anhydrous) methanol, ethanol, propanol, or the like (e.g., using an alcohol gas module). The structure of FIG. 2A may be exposed to the alcohol gas to expose residues 213 to the alcohol gas.

Figure 2B:
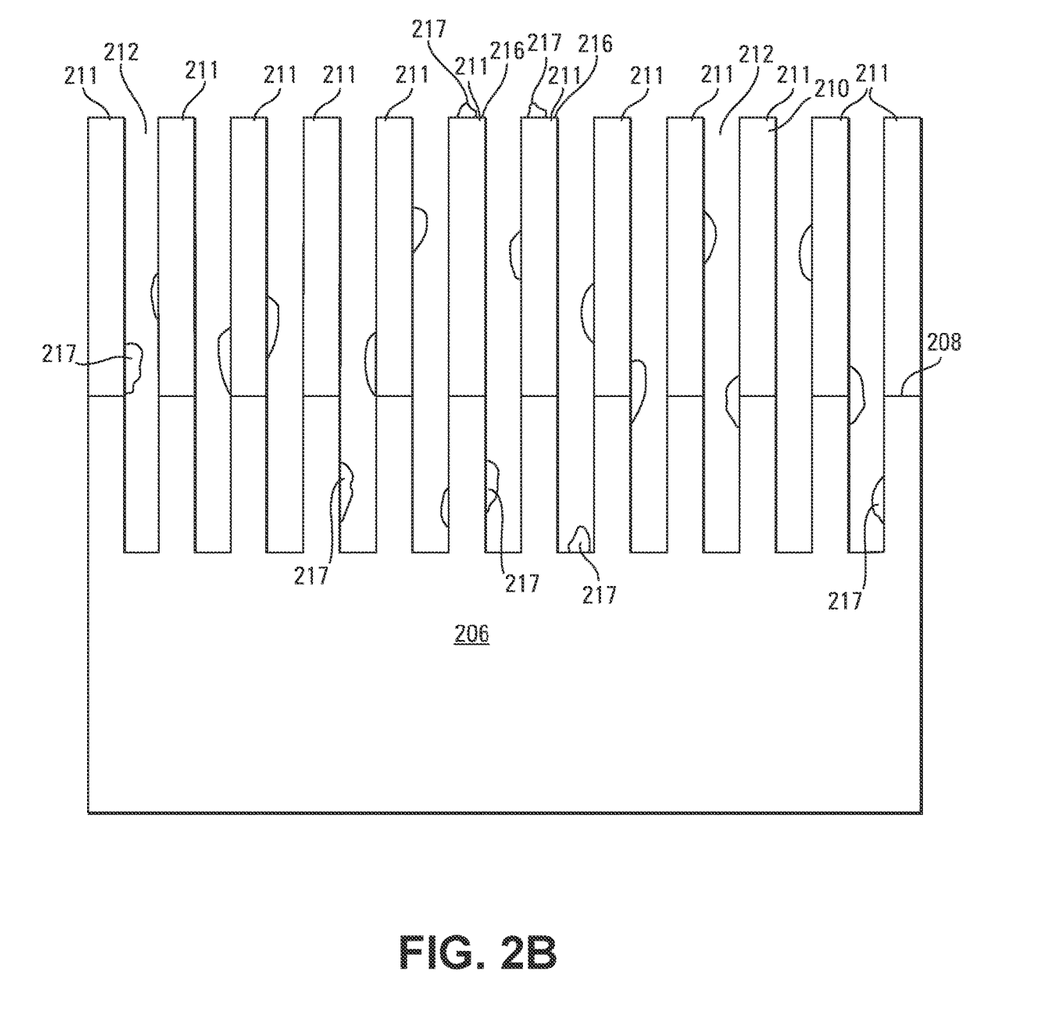

As shown in FIG. 2B, exposure of residues 213 to the alcohol gas forms residual volatile materials 217, such as volatile compounds, in openings 212 and on the upper surfaces 216 from residues 213 and the alcohol gas. For instance, the alcohol gas and residues may react to form volatile materials 217. Volatile materials 217 may be comprised of metallic elements, such as metal alkoxide materials, aluminum alkoxide materials, aluminum trimethoxide materials, and the like. In some examples, the volatile materials 217 may include volatile solids. In some instances, the alcohol gas may facilitate the removal of the silicon halides and may form methoxy terminated surfaces on the side surfaces and upper surfaces 216 of features 211 and on the bottoms of openings 212.

Figure 2C:
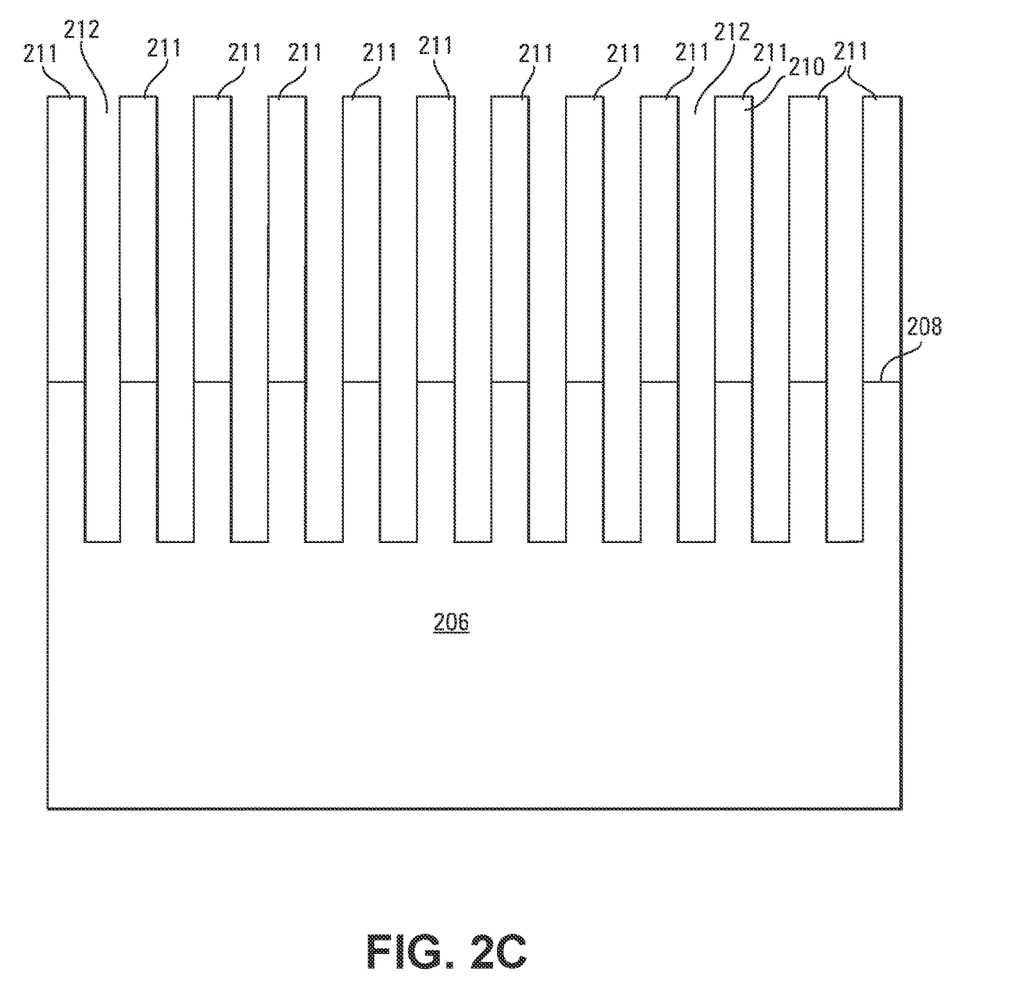

As shown in FIG. 2C, the dry-cleaning process includes removing volatile materials 217 by vaporization to form the structure of FIG. 2C. In some examples, volatile materials 217 may vaporize as soon as they are formed (e.g., immediately upon their formation). For example, volatile materials 217 may vaporize (e.g., volatilize) while the residue is reacting with the alcohol gas (e.g., in the chamber). This may result in the structure of FIG. 2C being formed directly from FIG. 2A. For example, the process may go directly from FIG. 2A to 2C. In such examples, the volatile materials 217 may form at a temperature and pressure at which the volatile materials 217 vaporize. For example, the temperature and pressure of a chamber in which the reaction occurs may be set to levels at which the volatile solid materials 217 vaporize.

In other examples, FIG. 2B may correspond to the reaction going to completion (e.g., the residue is done reacting with the alcohol gas). For instance, the structure of FIG. 2A may be exposed to the alcohol gas to produce the volatile materials 217 in FIG. 2B while at a temperature and pressure at which volatile materials 217 do not vaporize. For example, residues 213 may be reacted with the alcohol gas at a temperature and pressure at which volatile materials 217 do not vaporize. Subsequently, the temperature and/or pressure (e.g., in a chamber containing the structure of FIG. 2B) may be changed to levels at which volatile materials 217 vaporize. For example, after residues 213 and the alcohol gas are done reacting, the temperature and/or pressure may be changed so that volatile materials 217 vaporize. The vaporization removes volatile materials 217 to produce the structure of FIG. 2C from the structure of FIG. 2B.

Figure 2D:
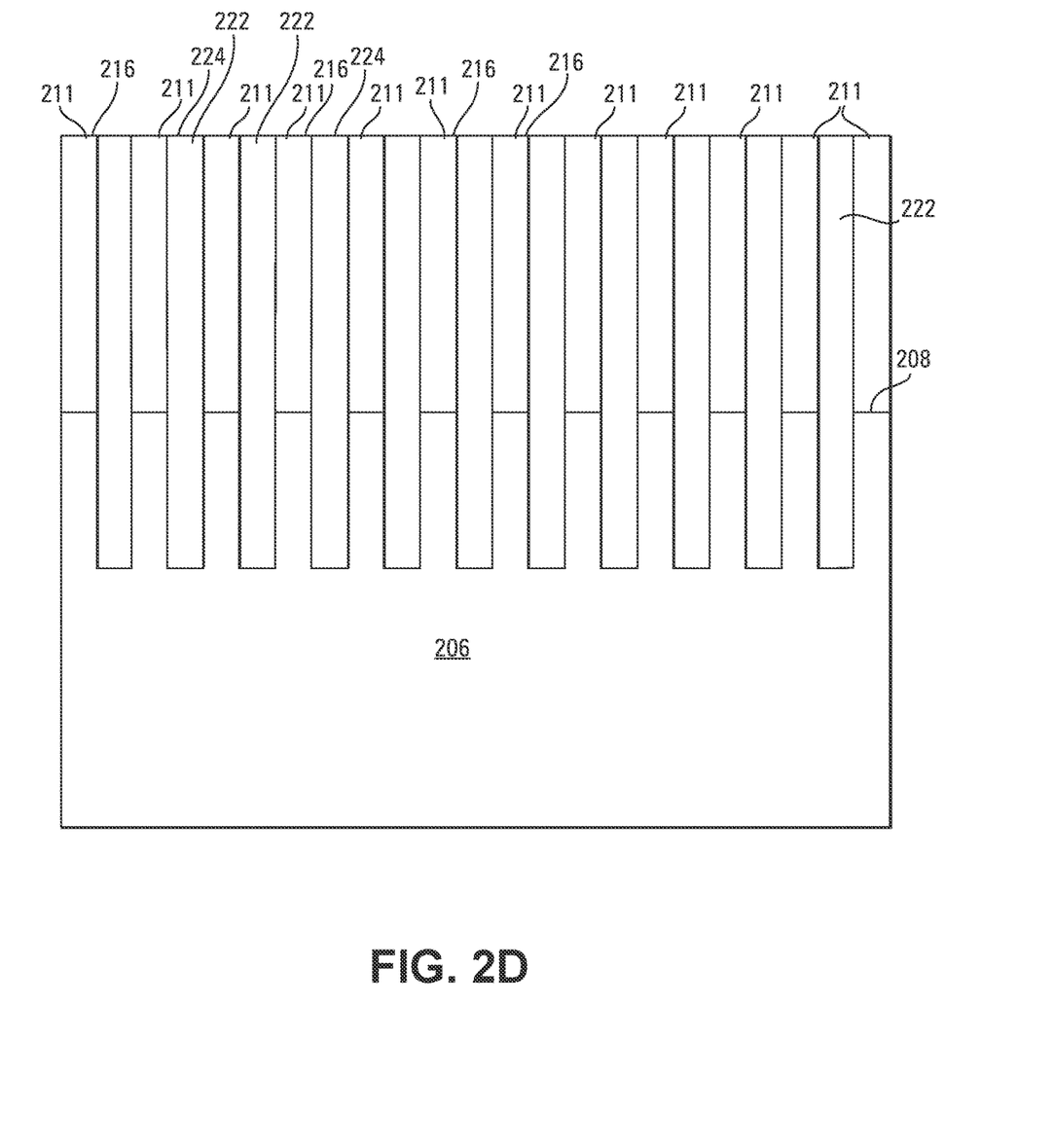

In some examples, as shown in FIG. 2D, a material 222 (e.g., a solid material) may be formed (e.g., at a deposition tool not shown) in the openings 212 in the structure of FIG. 2C. For example, material 222 may be formed in a gaseous phase or a plasma phase, such as by PVD, CVD, ALD, among others. For example, material 222 might be an epitaxial silicon material or a dielectric material, such as silicon oxide or silicon nitride. In some examples, material 222 may overfill openings 212 and extend over the upper surfaces 216 of features 211. Subsequently, a portion of material 222 may be removed, such as by chemical mechanical planarization (CMP) so that upper surfaces 224 of material 222 are coplanar with upper surfaces 216, as shown in FIG. 2D. In some examples, features 211 may form memory cells, such as non-volatile memory cells.

Figure 3:
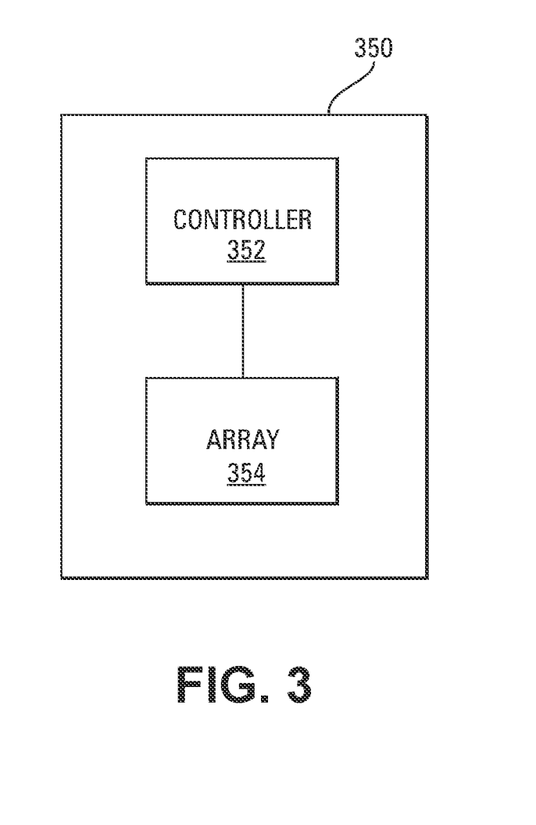
FIG. 3 is a block diagram illustration of an apparatus formed, at least in part, in accordance with a number of embodiments of the present disclosure.

FIG. 3 is a block diagram of an apparatus, such as a memory device 350. For example, memory device 350 may be a volatile memory device, such as a DRAM, a non-volatile memory device, such as NAND flash or NOR flash, among others. For example, memory device 350 may be formed, at least in part, using the processing previously described, such as in conjunction with FIGS. 2A-2D.

Memory device 350 includes a controller 352, such as an application specific integrated circuit (ASIC), coupled to a memory array 354, such as a DRAM array, a NAND array, a NOR array, among others. For example, memory array 354 might be formed, at least in part, according to the processing described previously.

The controller 352 can control the operations on the memory device 350, and of the memory array 354, including data sensing (e.g., reading) and data programming (e.g., writing), for example. Memory device 350 may be coupled to a host device (not shown in FIG. 3).

Figure 4:
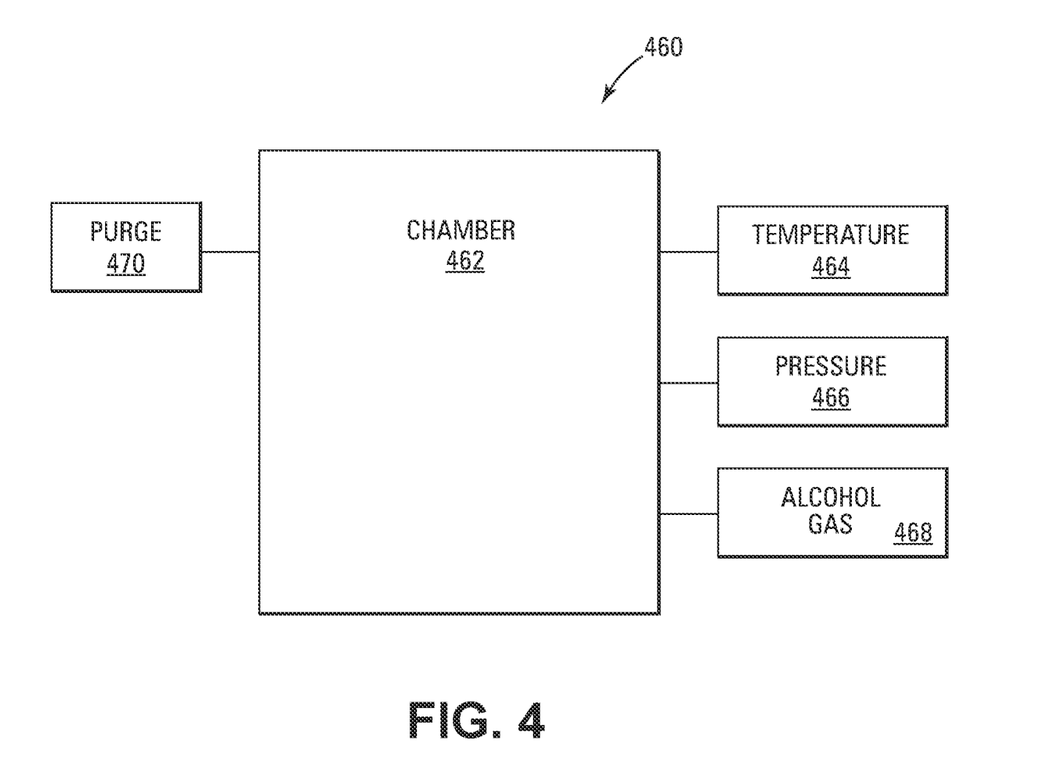
FIG. 4 illustrates a processing apparatus that may be used in conjunction with processing disclosed herein, in accordance with a number of embodiments of the present disclosure.

FIG. 4 illustrates a processing apparatus 460, such as a fabrication apparatus, that may be used in conjunction with processing associated with forming a semiconductor device, in accordance with a number of embodiments of the present disclosure. Processing apparatus 460 includes a chamber 462 (e.g., in which dry processing may be performed). In some examples the structure of FIG. 2A may be formed in chamber 462. Temperature controller 464 and pressure controller 466 are respectively used to control the temperature and pressure in chamber 462. Alcohol gas may be formed and supplied to chamber 462 using alcohol gas module 468. For example, the residue may react with the alcohol gas in chamber 462. A purge module 470 may be used to purge gasses from chamber 462.

Embodiments of the disclosure use a dry-cleaning process to clean residue (e.g., resulting from dry removal process, such as a dry etch). For example, a dry-cleaning process may involve exposing the residue to an alcohol gas to form a volatile compound, such as a volatile solid, and removing the compound by vaporization, such as by sublimation. The disclosed dry-cleaning processes avoid the wet-cleaning and subsequent drying processes, and thus the resulting feature collapses, of previous approaches.

Although specific examples have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A method of forming a semiconductor device, comprising:
   forming a plurality of features in a structure;
   reacting a residue, resulting from forming the plurality of features, with an alcohol gas to form a metal alkoxide material at a temperature and pressure at which the metal alkoxide material does not vaporize; and
   removing the metal alkoxide material by vaporization.

2. The method of claim 1, wherein removing the compound by vaporization comprises vaporizing the metal alkoxide material after the residue is done reacting with the alcohol gas.

3. The method of claim 2, wherein vaporizing the metal alkoxide material after the residue is done reacting with the alcohol gas comprises sublimation.

4. The method of claim 1, wherein the plurality of features are high aspect ratio features.

5. The method of claim 1, wherein the metal alkoxide material an aluminum alkoxide material.

6. The method of claim 1, wherein the residue comprises silicon halides.

7. The method of claim 1, wherein the residue comprises aluminum halides.

8. The method of claim 1, further comprising forming the plurality of features using a dry process.

9. A method of forming a semiconductor device, comprising:
   forming a plurality of features in a silicon-based structure;
   reacting a residue, resulting from forming the features, with an alcohol gas to form a metal alkoxide material at a temperature and pressure at which the metal alkoxide material does not vaporize;
   removing the metal alkoxide material; and
   forming a dielectric material in spaces between the features.

10. The method of claim 9, further comprising changing the temperature and/or pressure after the residue and the alcohol gas are done reacting so that the metal alkoxide material vaporizes.

11. The method of claim 9, wherein forming the plurality of features in a silicon-based structure comprises forming support pillars for a memory cell.

12. The method of claim 9, wherein the alcohol gas is methanol.

13. The method of claim 9, wherein forming the dielectric material in spaces between the features comprises forming an isolation region.

14. A method of forming a semiconductor device, comprising:
   removing a material from a structure to form an opening in the structure;
   exposing a residue, resulting from removing the material, to an alcohol gas to form aluminum trimethoxide at a temperature and pressure at which the aluminum trimethoxide does not vaporize;
   forming methoxy terminated surfaces, from the exposure of the residue and the alcohol gas, on the structure; and removing the aluminum trimethoxide by vaporization after the residue and the alcohol are done reacting.

15. The method of claim 14, wherein removing the aluminum trimethoxide by vaporization comprises reacting the residue with the alcohol gas at a temperature and pressure different from the temperature and pressure at which the aluminum trimethoxide is formed.

16. The method of claim 14, wherein removing the aluminum trimethoxide from the structure comprises a dry removal process.

17. The method of claim 14, wherein the alcohol gas is anhydrous alcohol.

* * * * *